United States Patent [19]
Valenzuela

[11] Patent Number: 5,145,001
[45] Date of Patent: * Sep. 8, 1992

[54] HIGH HEAT FLUX COMPACT HEAT EXCHANGER HAVING A PERMEABLE HEAT TRANSFER ELEMENT

[75] Inventor: Javier A. Valenzuela, Hanover, N.H.

[73] Assignee: Creare Inc., Hanover, N.H.

[*] Notice: The portion of the term of this patent subsequent to Jul. 9, 2008 has been disclaimed.

[21] Appl. No.: 690,521

[22] Filed: Apr. 23, 1991

Related U.S. Application Data

[63] Continuation-in-part of Ser. No. 383,979, Jul. 24, 1989, Pat. No. 5,029,638.

[51] Int. Cl.⁵ .............................................. F28D 7/00
[52] U.S. Cl. .................................. 165/164; 165/80.3; 165/185; 165/908; 165/907; 361/383
[58] Field of Search ................. 165/80.3, 80.4, 164, 165/185, 908, 907; 361/383-385

[56] References Cited

U.S. PATENT DOCUMENTS

| | | | |
|---|---|---|---|
| 3,481,393 | 12/1989 | Chu | 361/385 X |
| 4,494,171 | 1/1985 | Bland et al. | 361/386 |
| 4,561,040 | 12/1985 | Eastman et al. | 361/385 |
| 4,729,060 | 3/1988 | Yamamoto et al. | 361/385 |
| 4,733,293 | 3/1988 | Gabuzda | 357/81 |
| 4,750,086 | 6/1988 | Mittal | 361/382 |
| 4,759,403 | 7/1988 | Flint et al. | 165/804 |
| 4,823,869 | 4/1989 | Arnold et al. | 165/85 |
| 4,896,719 | 1/1990 | O'Neill et al. | 165/170 |
| 4,910,642 | 3/1990 | Downing | 361/382 |
| 5,029,638 | 7/1991 | Valenzuela | 165/164 |

OTHER PUBLICATIONS

Machine Design, Nov. 13, 1989.
AIAA 90-1684-High Heat Flux Single Phase Heat Exchanger, Jun., 1990, J. Valenzuela & M. Izenson.
Compact High Performance Heat Exchanger For Space Thermal Management, Aug. 1988, M. G. Izenson & J. A. Valenzuela.

*Primary Examiner*—Allen J. Flanigan
*Attorney, Agent, or Firm*—Michael J. Weins

[57] ABSTRACT

The present invention is directed to a compact heat exchanger having a permeable heat transfer element and an impervious heat transfer element. Fluid passes through the permeable element through passages which are substantially normal to the interface between the permeable and impervious elements. The fluid passes into channels which are provided at or near the interface between the permeable heat transfer element and the impervious element. Heat is transferred between the fluid and the permeable heat transfer element by convection as the fluid flows through the permeable element. Heat is transferred between the impervious element and the permeable element by conduction. The permeable element can be formed from one or more plates which bound one or more passages through which the fluid flows or can be formed from various porous material such as sintered powders, rods and metal foams.

39 Claims, 9 Drawing Sheets

HIGH HEAT FLUX COMPACT HEAT EXCHANGER HAVING A PERMEABLE HEAT TRANSFER ELEMENT

This is a continuation-in-part of U.S. patent application Ser. No. 383,979, filed on Jul. 24, 1989, now U.S. Pat. No. 5,029,638.

FIELD OF INVENTION

The present invention relates to a heat exchanger, and more particularly, to an improved compact heat exchanger having both a permeable heat transfer element and an impervious heat transfer element.

BACKGROUND

Heat exchangers which transfer heat to or from a single phase fluid are referred to as single-phase heat exchangers and are used in a variety of applications, ranging from air cooled radiator in automobile to the exotic water-to-ammonia heat exchanger in the living module of the space station. In addition to applications involving the transfer of heat between fluids, single phase gas and liquids are frequently used to remove waste heat from equipment, such as electronic devices, electric motors, internal combustion engines, and power plant condensers. Single phase heat exchangers are used in conjunction with power generation in such applications as pressurized water nuclear reactors and gas-cooled nuclear reactors to remove the energy from the nuclear fuel.

Conventional single-phase heat exchangers cannot achieve high heat fluxes with low pressure drops because of limitations in the heat transfer coefficient. Heat transfer coefficients in conventional single-phase heat exchangers are typically a factor of 10 to 100 less than in boiling or condensing heat exchangers.

Gas cooled heat exchangers are particularly limited in their heat flux capacity because gases have very low heat capacity per unit volume.

The physical size and/or the weight of a heat exchanger can be a burden in some applications. In these applications the heat transferred per unit weight, or per unit volume must be considered when selecting a heat exchanger. Compact heat exchangers are distinguished by having a relatively high mass and/or volume specific capacity when compared to conventional heat exchangers. The book entitled: COMPACT HEAT EXCHANGERS by William M. Kays and A. L. London, McGraw-Hill 1984, is a standard reference for the design and performance analysis of compact heat exchangers. The definitions and terminology used herein will be consistent with those used in COMPACT HEAT EXCHANGERS.

Compact heat exchangers are used in applications where it is desired to reduce the weight and/or volume of the heat exchanger. Compact heat exchangers usually have multiple fluid paths within a confined space to increase the area of the heat exchange surface relative to the volume or the weight of the heat exchanger. Increasing the area by creating multiple fluid paths is frequently achieved by the use of fins.

Alternatively, some compact heat exchangers employ porous heat transfer surfaces to increase the surface area over which the heat transfer fluid passes.

D. B. Tuckerman and R. F. W. Pease in an article entitled "HIGH-PERFORMANCE HEAT SINK FOR VLSI", IEEE ELECTRON DEVICE LETTERS Vol. EDL-2, NO. 5, May 1981, pp 126-29, discuss the use of fins attached to a VLSI substrate. Closely spaced fins are attached to the substrate and fluid is passed by the fins flowing parallel to the substrate. The fins are effective in transferring heat but cause large pressure drops in the fluid.

A number of prior art patents are directed to various aspects of compact heat exchangers. U.S. Pat. No. 3,595,310 of Frederic A. Bernie and Emery I. Valyi, entitled MODULAR UNITS AND USE THEREOF IN HEAT EXCHANGERS, teaches and claims a modular heat exchanger element which comprises a tube which is in turn surrounded by a layer of porous heat conductive material. The '310 patent suggests that the tube be formed of a metal and that the porous tube heat conductive material that surrounds the metal tube be formed of a high heat conductive material such as copper. The patent suggests forming a heat exchanger by combining pieces of the element formed from a soft tube surrounded by a porous material. The porous material is intended to increase the effective surface area in contact with the heat transfer fluid.

U.S. Pat. No. 4,359,181 of John Chisholm, entitled PROCESS FOR MAKING A HIGH HEAT TRANSFER SURFACE COMPOSED OF PERFORATED OR EXPANDED METAL, teaches the process for making a heat transfer surface for a cross flow heat exchanger. The surface is formed by stacking layers of a porous metal lattice or woven material. The stacked material forms volumes having increased surface areas and these volumes are separated by an impervious interface. The flow is in a direction which is substantially parallel to the direction of the impervious interface.

U.S. Pat. No. 4,318,393 of Richard Goldstein, entitled POROUS SURFACE SOLAR ENERGY RECEIVERS, teaches a porous surface receiver for collecting reflected solar radiation. Air is employed as the heat transfer fluid is passed through the porous surface, which is heated by the reflected solar radiation. The patent requires that the air pass through the heat transfer element, does not teach an impervious heat transfer element, and would not be suitable for transferring heat from a solid heat sink.

U.S. Pat. No. 4,494,171 of Timothy J. Bland and Richard E. Niggerman, entitled IMPINGEMENT COOLING APPARATUS FOR HEAT LIBERATING DEVICE, discloses a heat exchanger which uses a series of stacked plates with orifices therein. The plates are parallel to the heat sink which they cool. The orifices generate high velocity jets of the heat transfer fluid which increase the heat transfer, but the orifices restrict the flow which results in large pressure drops as the fluid passes through the heat exchanger.

While the use of fins and/or porous material can increase the heat transfer by increasing the surface area, a large pressure drop in the heat transfer fluid will occur as the heat extracting fluid travels a long torturous path through the heat transfer surface.

Thus there is a need for a heat exchanger which will have high heat flux capability and operate with small pressure drops.

SUMMARY OF INVENTION

It is an object of the present invention to provide a single-phase heat exchanger with a high surface heat flux capability.

It is another object of the present invention to provide a compact heat exchanger in which the heat transfer fluid experiences only a small pressure drop as it passes through the heat exchanger.

Yet another object of the present invention is to provide a small and light heat exchanger having high effectiveness.

A further object of the invention is to provide a heat transfer element which will effectively transfer heat from a liquid to a gas with only small pressure drops in the gas.

These and other objects of the present invention will become apparent to one skilled in the art from the following descriptions, figures, and claims.

The present invention is directed to a compact heat exchanger having a module with a permeable heat transfer element having passages through which a heat transfer fluid flows. The permeable heat transfer element joins an impervious heat transfer element, forming a permeable/impervious interface. The permeable/impervious interface provides a high thermal conductivity path therebetween. The permeable heat transfer element and the impervious heat transfer element are preferably fabricated from a high thermal conductivity material.

In one preferred embodiment the permeable element is fabricated from one or more plates so configured to bound the passages. A spiral wound plate can be used to form a single plate porous material while a series of spaced apart stacked plates can be use to produce a multi-plate permeable heat transfer element. In both cases the plates are positioned substantially normal to the permeable/impervious interface, thereby providing passages substantially normal to the permeable/impervious interface.

In a second preferred embodiment the permeable heat transfer element is a porous material formed from interconnected particulate materials such as rods, foamed metal, sintered metal powders or other structures where pores between the interconnected particles create passages through the porous material. Porous materials made from these materials will have numerous passages that are substantially normal to the permeable/impervious interface.

Means are provided for directing the flow through the passages which are substantially normal to the permeable/impervious interface. In the case where the passages are bound by plates the flow will be restricted and the flow will generally be normal to the interface if the plates are sufficiently long that the end effects are negligible. Having a passage length to passage width ratio greater than 5 will provide a means for directing the flow through said passages substantially normal to the permeable/impervious interface with negligible end effects.

In the case of the open ended passage, end walls closing the passages can also be employed as a means for directing the flow through the passages substantially normal to the permeable/impervious interface.

Alternatively when the permeable/impervious interface forms an open ended closed surface, such as can be generated by rotation or translation of a linear element parallel to an axis, other means can be employed. Illustrative examples of such open ended closed surfaces would be an hour glass, rectangular tube, cylindrical tube and an elliptical tube. For example, means for directing the flow of fluid through passages substantially normal to an open ended closed surface permeable/impervious interface which is generated about an axis can be provided by positioning the passages such that they are substantially normal to the axis of the open ended closed surface and form continuing passages which close on themselves, thereby eliminating the end effect.

In the case of porous materials one or more sidewalls can be employed around the porous material which forms the permeable element. The sidewalls can serve as a means for directing the flow substantially normal to the permeable/impervious interface by blocking flow in the path parallel to the interface.

Preferably, in this case, the passages in the permeable heat transfer element have hydraulic diameters which are less than or equal to about 1 mm. The hydraulic diameter is defined as four times the cross sectional area of the passage divided by the perimeter of the cross section. For a circular cross section this results in the hydraulic diameter being the diameter of the circle.

The channels provided are in close proximity and preferably intercept the permeable/impervious interface. Channels communicate with the passages in the permeable element and provide for removal of the heat transfer fluid which passes through the passages.

Preferably the channels provided which intercept the permeable/impervious interface, are grooves in the impervious element. This configuration provides for maximum thermal contact between the permeable element and the impervious element.

In the heat exchanger of the present invention the fluid experiences a small pressure drop relative to the pressure drop experienced in conventional compact heat exchangers because the path length through the permeable heat transfer element is relatively short, on the order of 1 to 5 mm and fluid velocity relatively low, on the order of a few cm/sec for liquids

BEST MODE OF CARRYING THE INVENTION INTO PRACTICE

Figure 1:
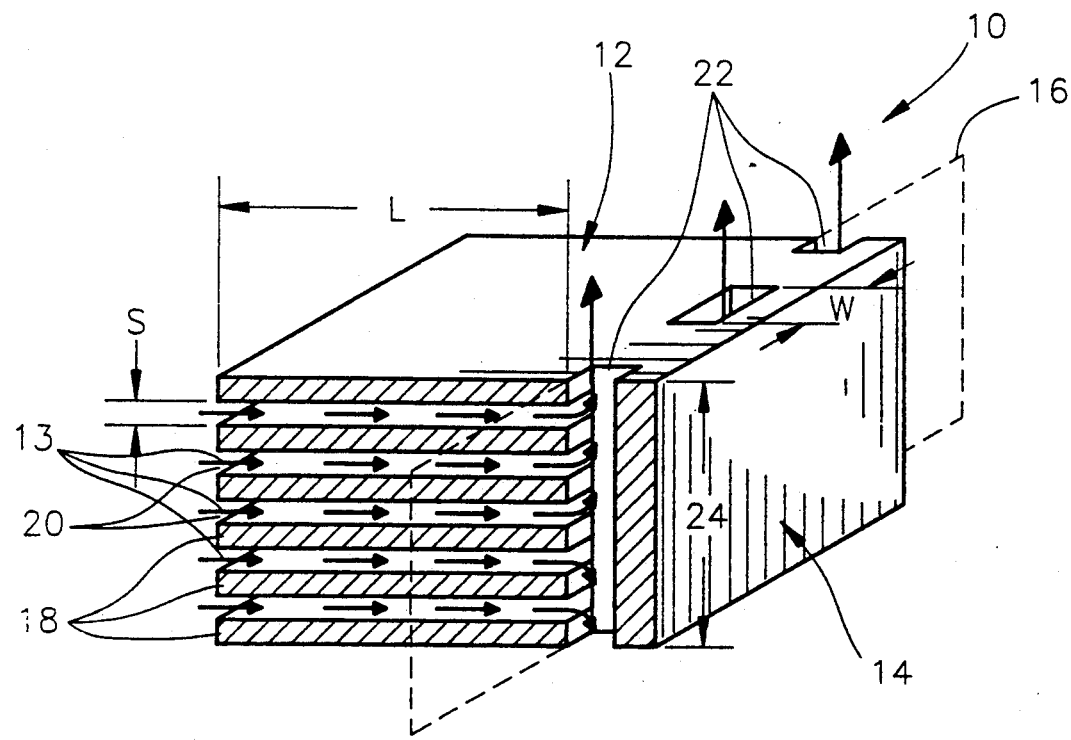
FIG. 1 is a schematic representation of a segment of a heat exchanger module for one embodiment of the present invention showing a portion of the permeable and impervious heat transfer elements and the permeable/impervious interface. The permeable heat transfer element is constructed from plates in close proximity with spaces therebetween positioned such that the plates and passages created therebetween are substantially normal to the permeable/impervious interface. The figure illustrates the flow path of the heat transfer fluid through the permeable and the impervious heat transfer elements.

FIG. 1 shows a central segment of one embodiment of a heat exchanger module 10 of the present invention. The heat exchanger module 10 has a permeable heat transfer element 12 through which a heat transfer fluid flows as is illustrated by the arrows 13. An impervious heat transfer element 14 joins the high thermal conductivity permeable heat transfer element 12 at a permeable/impervious interface 16.

The preferred materials for the impervious heat transfer element 14 and the permeable heat transfer element 12 are highly conductive materials. Metals such as copper or aluminum can be employed when the operating temperatures are sufficiently low and the fluid does not interact with the metals resulting in corrosion products which foul the surface. For higher operating temperatures or when the heat transfer fluid will foul the surface, then higher melting point materials or more corrosion resistant materials such as stainless steel or graphite are preferred.

In the embodiment of FIG. 1 the permeable heat transfer element 12 is formed by plates 18 in close proximity with spaces therebetween. The plates 18 are substantially normal to the permeable/impervious interface 16, which assures that the spaces between the plates 18 form passages 20 which are substantially normal to the permeable/impervious interface 16. These passages 20, being so positioned, serve as means for directing the fluid substantially normal to the permeable/impervious interface 16 in the central portion of the passages 20.

As the fluid flows through passages 20 the fluid extracts heat by a convective process from the plates 18 which in turn extracts heat from the impervious heat transfer element 14 by conduction. Having the fluid flow along the plates 18 towards the permeable/impervious interface 16 provides an effective method for extracting the heat.

Figure 2:
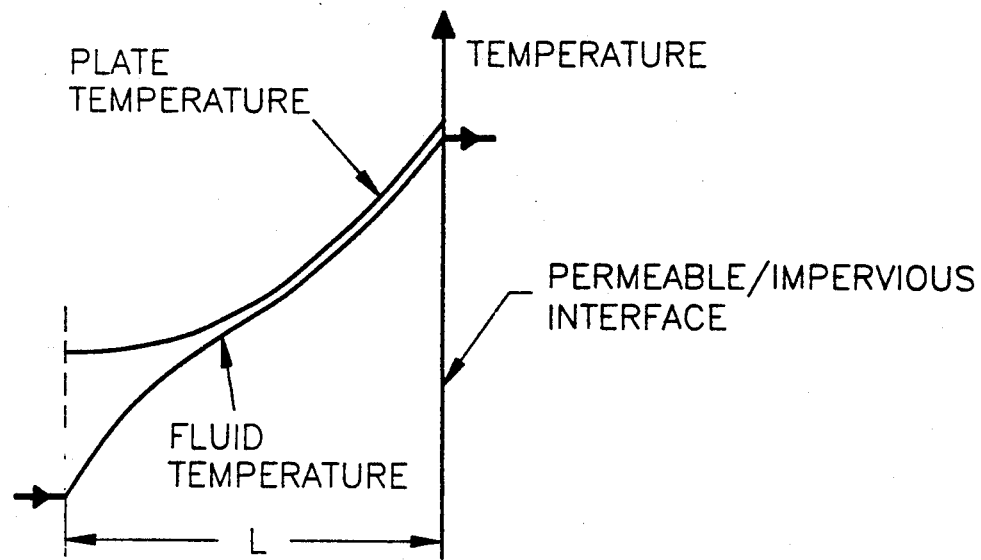
FIG. 2 is a schematic representation of the temperature profile in the plates and the fluid temperature profile as a function of the position along the passages formed between the plates.

FIG. 2 illustrates the temperature profile along the plates 18 as a function of the distance from the permeable/impervious interface 16. The temperature profile depicted in FIG. 2 results from heat being transferred to the impervious element 14 and extracted by the permeable element 12. It should be apparent to one skilled in the art that the heat exchanger 10 could be operated with heat being extracted from the impervious element 14 and added to the permeable element 12. FIG. 2 also illustrates the temperature profile in the fluid as it approaches the permeable/impervious interface 16.

Since the passages 20 between the plates 18 are small, typically 0.1 mm or less, the fluid is in very good thermal communication with plates 18. The temperature of the fluid rapidly approaches the temperature of the plates 18 upon entering the permeable element 12. As can be seen, the temperature gradient in the plates 18 is aligned with the temperature gradient in the fluid. Since the plates 18 are conducting heat away from the permeable/impervious interface 16, the temperature of the plates 18 decreases with distance away from that interface. Since heat is being added to the fluid as it flows between the plates 18, the temperature of the fluid increases as the fluid flows toward the permeable/impervious interface 16. This favorable temperature distribution results in a fluid exit temperature approaching the temperature of the impervious element 14 and, hence, this heat exchanger has high effectiveness. High effectiveness can be achieved with this heat exchanger even when operating at high heat fluxes. Operation at high heat fluxes increases the temperature gradient in the plates, but the exit temperature of the fluid still approaches the temperature of the impervious element.

Another important feature of the heat exchanger is that high thermal performance is achieved even when the length L of the plates 18 is very small, typically 2-5 mm. Increasing the length of the plates 18 has little effect on the exit temperature of the fluid or the heat flux at the permeable/impervious interface 16. Small plate lengths L result in very compact heat exchanger design. Small plate lengths L also result in very low pressure drops.

Preferably the passages 20 of the permeable heat transfer element 12 have hydraulic diameters which are less than or equal to about 1 mm. The hydraulic diameter is defined as four times the cross sectional area of the passages divided by the perimeter of the cross section. For a series of closely spaced plates this would correspond to a separation of less than about 0.5 mm.

Channels 22 are in close proximity to and preferably intersect the permeable/impervious interface 16 and communicate with passages 20 in the permeable element 12. It is further preferred that the channels 22 lie in the impervious heat transfer element 14. This can readily be accomplished for a permeable/impervious interface 16, which is planar, by employing rectangular channels 22. When circular channels are employed to simplify fabrication, then the diameter of the channel 22 preferably lies in the permeable/impervious interface 16.

It is further preferred that the channels 22 intersect about one half of the porous/impervious interface 16 and that the channels 22 be sized such that they provide a hydraulic diameter which is an order of magnitude greater than the hydraulic diameter of the passages 20.

It is also preferred that the length L of the passages 20 be greater than about three (3) times the hydraulic diameter of the channels 22. For square channels illustrated in FIG. 1 the hydraulic diameter becomes the width W of the channels 22, and the length L of the spaced apart plates 18 should be maintained greater than 3W.

The length 24 of the channels 22 should preferably be maintained at less than about 2 cm so as to maintain uniform flow through all the passages.

Figure 3:
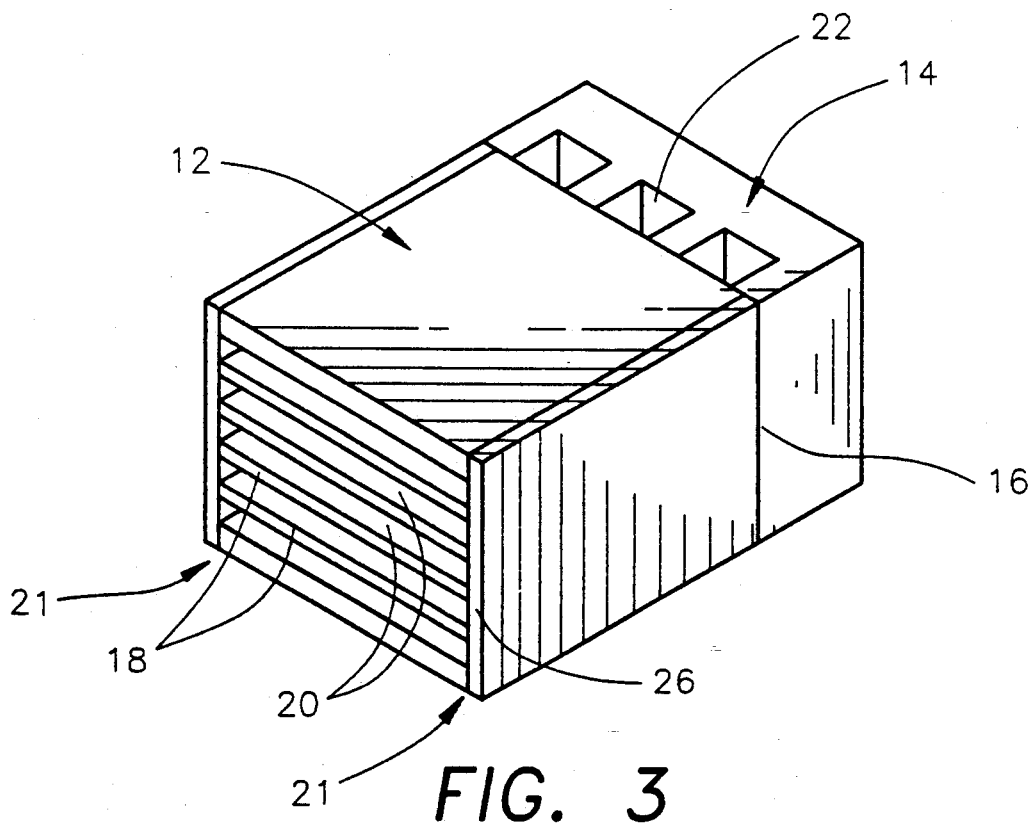
FIG. 3 is a schematic representation of the heat exchanger module of FIG. 1 showing end walls which provide means to direct the fluid flow near the end of the passages, such that the flow remains substantially normal to the permeable/impervious interface.

FIG. 3 illustrates a module of FIG. 1 which provides end walls 26 which are normal to the permeable/impervious interface 16 and close the passages 20 in the direction parallel to the permeable/impervious interface 16. These end walls 26 serve as means to direct the heat transfer fluid flowing through the vicinity of the ends 21 of the passages 20 substantially normal to the permeable/impervious interface 16.

Other means may be employed to promote flow normal to the porous/impervious interface 16 for other geometries of the heat exchanger module. If the interface is curved and creates an open ended closed surface, such as a surface of revolution or translation about an axis and the plates are substantially normal to the axis, then the passages formed between the plates becomes continuous.

Figure 4:
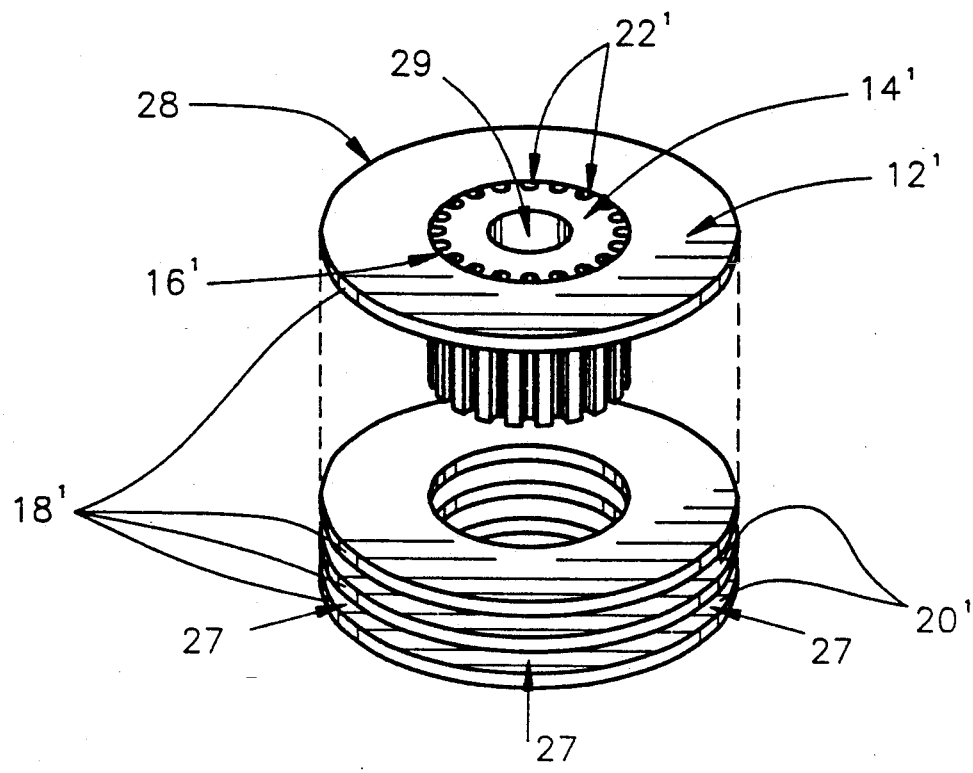
FIG. 4 illustrates a heat exchanger where the permeable/impervious interface forms an open ended closed surface which is cylindrical and passes through plates which encircle the permeable/impervious interface, forming passages which direct the flow in the radial direction.

FIG. 4 illustrates an open ended closed surface permeable/impervious interface 16' which is cylindrical and a surface of revolution. In this case the permeable/impervious interface forms an open ended closed surface and the surface passes through the closely spaced apart plates 18' which are substantially normal to the permeable/impervious interface 16'. Having this spacial relationship between the plates 18' and the interface 16' generates passages 20' in the permeable element 12' which are continuous in the circumferential direction. For the cylindrical surface of FIG. 4, when radial flow, as indicated by the arrows 27, is maintained then the direction of flow will be substantially normal to cylindrical permeable/impervious interface 16'. This condition will be met when the pressure gradient in the circumferential direction around the heat exchanger module is much smaller than the pressure gradient in the radial direction in the permeable heat transfer element. A small circumferential pressure gradient can be readily achieved by using a suitable flow plenum surrounding the heat exchanger module.

The heat exchanger module of FIG. 4 has a central passage 29 therethrough. This passage can be employed to transport a fluid from which heat is extracted or alternatively a heat source can be embedded therein and the heat exchanger module used to extract heat from the element.

While the means for directing the flow substantially normal to the permeable/impervious interface 16 of FIG. 3 are end walls 26 other means are also available. Having plates 18 sufficiently long such that flow out the side of the passages 20 resulting from not employing end plates 26 will be small compared to the flow into the passages 20. With the plates 18 sufficiently long, the passages 20 will provide means for directing the flow substantially normal to the permeable/impervious interface.

Figure 5:
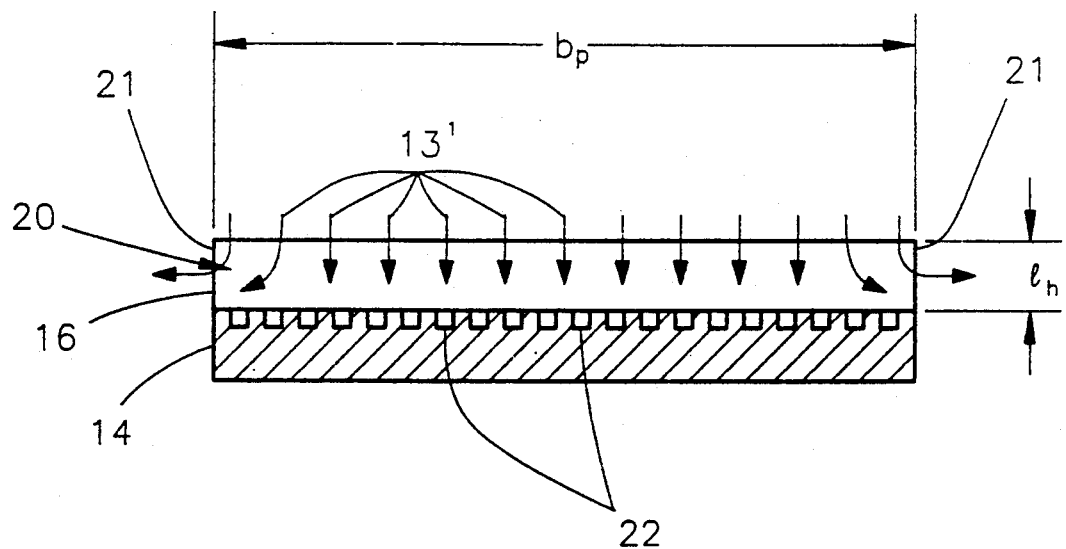
FIG. 5 illustrates a compact heat exchanger employing plates, where the breadth of the plates as measured along the permeable/impervious interface, is large as compared to the height of the plates. For such a configuration the fluid flow in the passages is substantially normal to the permeable/impervious interface over the major portion of the interface. In this case the breadth to height ratio provides the means to direct the flow.

FIG. 5 shows such a configuration for a series of plates in close proximity with spaces therebetween where the passage sides 21 are open. The arrows 13' illustrate the flow in a passage 20 when passage height $l_h$ is much less than passage breadth $b_p$. For this configuration the flow will be as shown by the arrows 13' and end effects will be negligible. The ratio of $b_p/l_h$ should preferably be maintained greater than about 5 to assure substantially normal flow to the permeable/impervious surface and that the end effect resulting from the open sides 21 of the passage 20 will be negligible.

Figure 6:
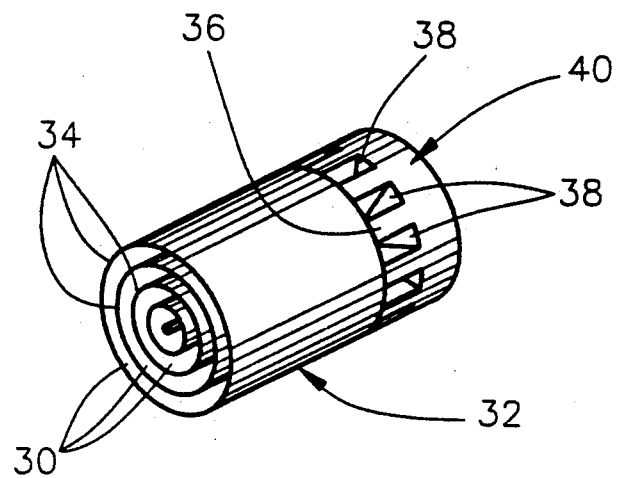
FIG. 6 is another embodiment of the present invention where the permeable element is formed from a series of concentric walls in close proximity with spaces therebetween.

FIG. 6 illustrates another embodiment of the invention with another configuration of passages 30 in the permeable heat transfer element 32. The passages 30 form concentric rings which are separated by cylindrical plates 34. The cylindrical configuration of the plates 34 serve as means for directing the fluid through passages 30 normal to the permeable/impervious interface 36 since the passages 30 close on themselves in the radial direction thereby eliminating any end effect. The fluid exits via a series of rectangular radial channels 38 which intersect the permeable/impervious interface 36 and reside in the impervious heat transfer element 40.

Figure 7:
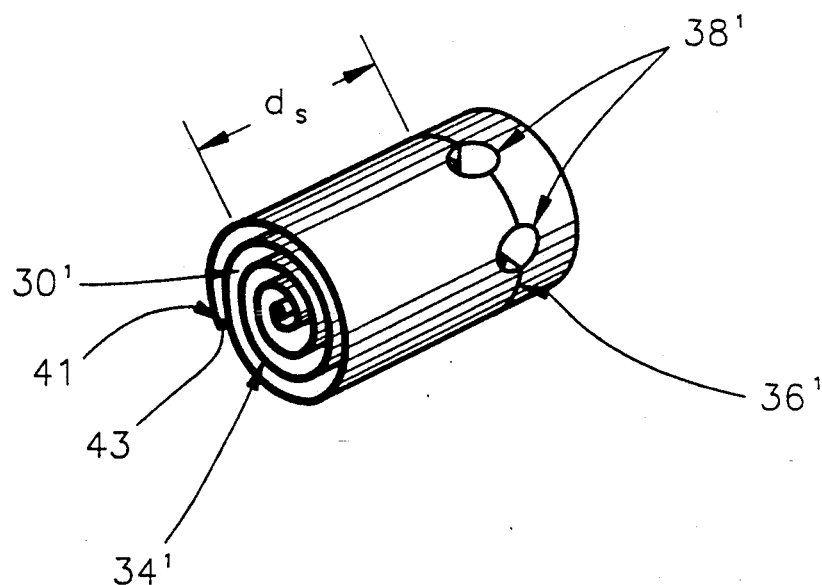
FIG. 7 is a variation of the embodiment of FIG. 6 wherein the permeable element is formed from a spiral element.

While the permeable heat transfer element 32 is illustrated as a series of concentric cylindrical plates 34 in FIG. 6, a spiral plate 34' as illustrated in FIG. 7 will serve equally well as the permeable element. The spiral plate 34' bounds a spiral passage 30' which terminates in a free end 41. The spiral plate 34' directs fluid through the passage 30' substantially normal to the permeable/impervious interface 36', with the exception of the region of the channel near the free end 41. The spiral plate 34' and the associated spiral passage 30' terminates with a free end 41. If the spiral path $p_s$ is large compared to the spiral passage height $l_s$, $p_s/l_s$ preferably greater than 3, then the geometry will make the end effect negligible. Maintaining the length ratio high provides means for directing flow substantially normal to the permeable/impervious interface. Alternatively, an end plate 43 can be employed to provide means for directing the flow normal to the permeable/impervious interface 36' in the vicinity of the free end 41.

Cylindrical channels 38' are employed and are positioned with respect to the permeable/impervious interface 36' such that the diameters of the channels 38' lie in the interface.

Figure 8:
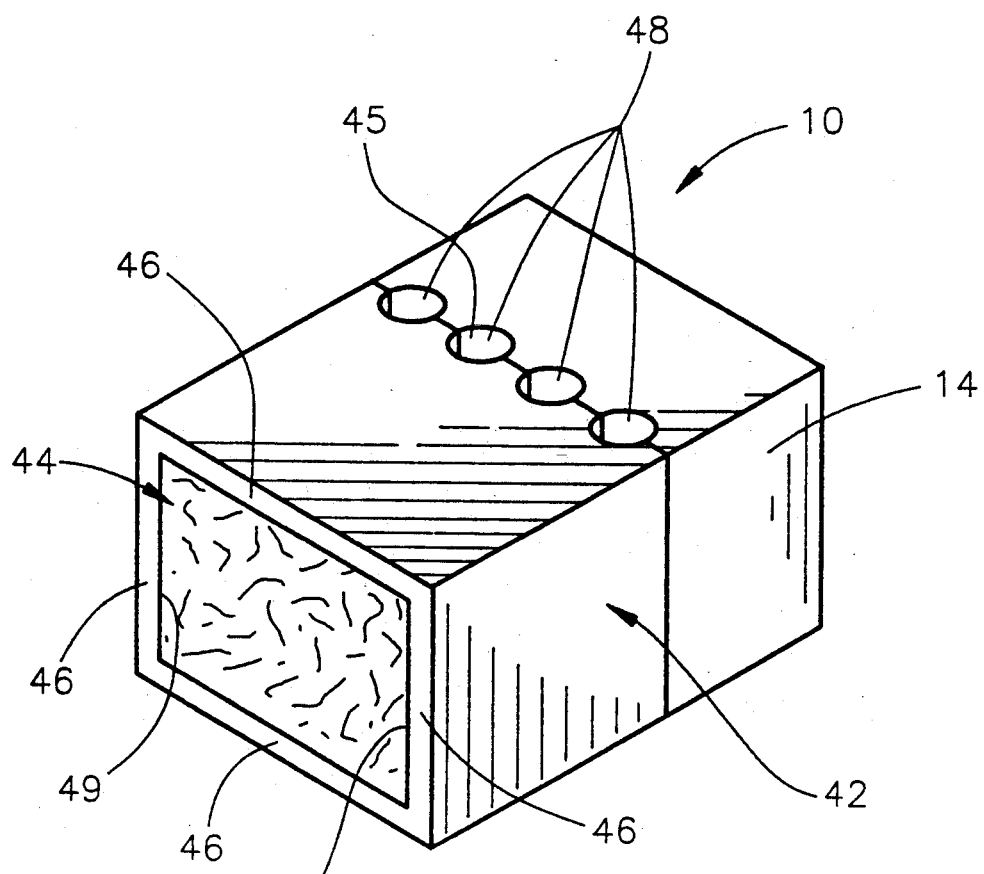
FIG. 8 is another embodiment of the present invention where the permeable element is a porous material such as sintered powdered metal or foamed metal. The means for directing the flow normal to the permeable/impervious interface is a sidewall surrounding the porous material.

FIG. 8 illustrates another heat transfer module of the present invention having a permeable heat transfer element 42 constructed of a porous material 44 such as foamed metal, or a sintered powder metal. These materials have interconnected pores which provide passages which pass through the material. Many of these passages are substantially normal to the permeable/impervious interface 45. The effective lengths of passages normal to the permeable/impervious interface 45 are generally longer than the passages resulting from the permeable configurations generated from materials made from plates in close proximity. In general the effective length of the path generated by interconnecting pores will be about 1.5 the length resulting from spaced apart plates.

One or more sidewalls 46 surround the surfaces of the porous material 44 normal to the permeable/impervious interface. The sidewalls 46 provide means for directing the fluid through the porous material substantially normal to the permeable/impervious interface 45 and reduces fluid flow through paths of connected pores that are parallel to the permeable/impervious interface 45. Channels 48 lie in the permeable/impervious interface 45.

When porous materials are employed for the permeable elements then provisions must be made to assure the porous/impervious interface 45 provides a highly conductive path between the high thermal conductivity porous heat transfer element 44 and the high thermal conductivity impervious heat transfer element 14. This can frequently be done by brazing the porous element 44 to the impermeable element 14. In so doing the braze material will wet the porous material and the interface will tend to be somewhat irregular.

If the permeable heat transfer element 42, has a porous element 44 fabricated from a material such as a sintered metal element or a foamed metal, preferably a pore size of less than about 0.5 mm should be maintained.

As discussed with respect to the embodiment illustrated in FIG. 3, the means for directing the flow will vary depending on the geometry of the permeable material. In the case of porous material, since there is generally little directionality in the structure with respect to passages therethrough to maintain flow normal to the permeable/impervious interface, a wall 46 surrounding the porous material 44 will generally be required.

These conditions can be relaxed for some configurations. The requirement for a sidewall can be eliminated by an appropriate choice of the dimensions of the porous element. When the height $l_h$ of the porous element, the dimension normal to the permeable/impervious interface is substantially less than the breadth $b_p$ of the porous element as measured parallel to the permeable/impervious interface then flow will be essentially normal to the interface. It is preferred that the ratio of $b_p/l_h$ should be greater than 5.

Figure 9:
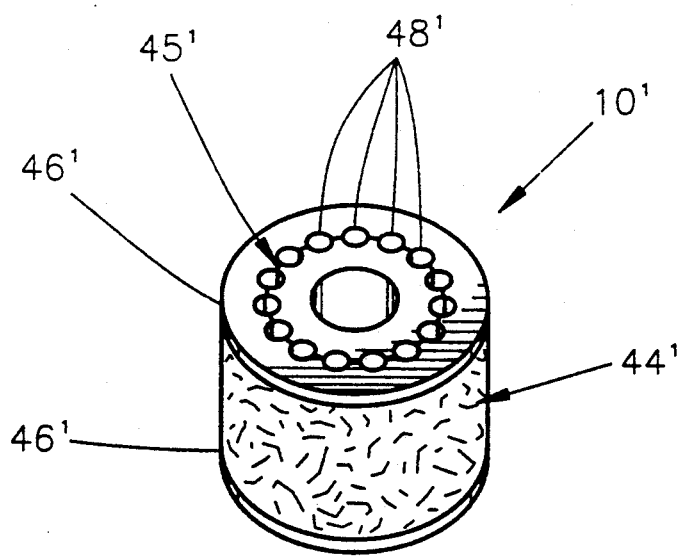
FIG. 9 illustrates a heat exchanger where the permeable element is a porous material, such as sintered powdered metal, or foamed metal and differs from the embodiment of FIG. 8 in that the permeable/impervious interface forms an open ended closed surface which is a cylindrical surface. The porous material around the cylindrical surface illustrated creates a porous material which is endless in the circumferential direction.

Another such configuration is illustrated in FIG. 9 where the permeable/impervious interface 45' forms an open ended closed surface; in the example of FIG. 9 this surface is a cylindrical surface. A pair of spaced apart sidewalls 46' bound the porous material 44'. The permeable/impervious interface 45' is positioned such that it passes through the spaced apart sidewalls 46' and the porous material 44' and that the spaced apart sidewalls 46' are substantially normal to the permeable/impervious interface. In this case the porous material forms an annulus around the permeable/impervious interface. With the porous material so configured, the composite structure of the sidewall 46' and the annulus of the porous material 44' serves as a means for directing the fluid through the passage in the porous material 46' that are substantially normal to the permeable/impervious interface. The fluid is then carried away by the channels 48'.

Figure 10:
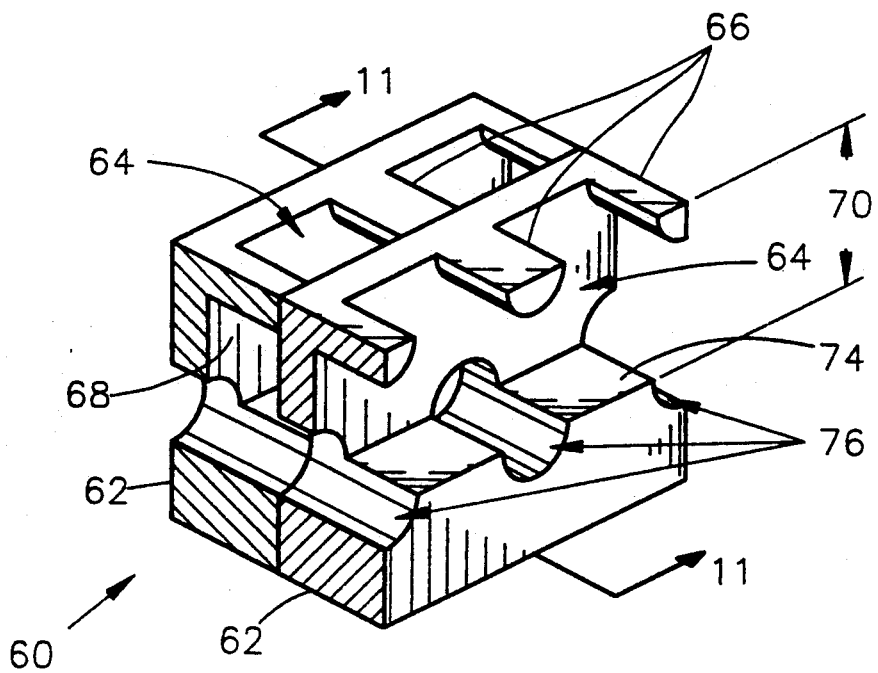
FIG. 10 is a segment of a heat exchanger module where the structure is produced by stacking plates which have been coined to provide recesses in their surfaces. The coined plates are stacked so as to provide a permeable element and an impervious section. Cylindrical channels pass through the stacked plates such that their diameters lie in the interface between the permeable element and the impervious element.
Figure 11:
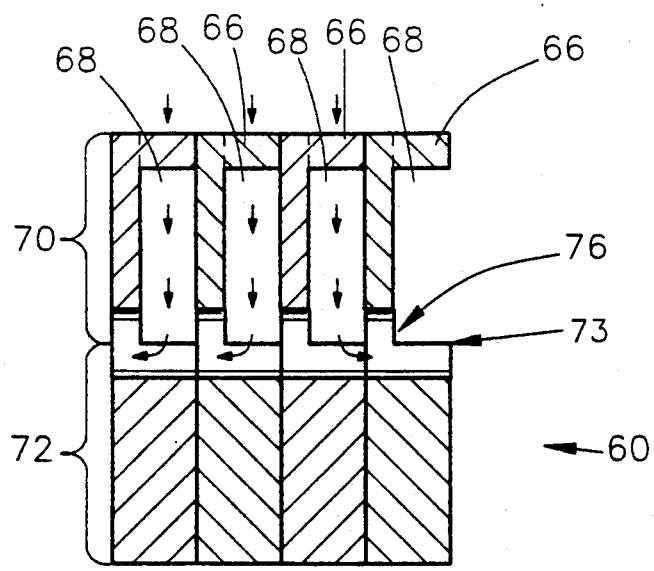
FIG. 11 is a cross section of the heat exchanger module of FIG. 10, illustrating the permeable element, the impervious element, and the location of the cylindrical channels with respect to the permeable/impervious interface.

FIG. 10 is a schematic representation of a segment of a heat exchanger module 60 formed by stacking plates 62. The structure of this module 60 is similar to the plate construction of FIGS. 1 and 3. The embodiment of FIG. 10 provides for greater rigidity. Each of the plates 62 is coined to form recessed region 64 having bosses 66. When the plates are stacked as illustrated in FIG. 11 the recessed regions 64 as shown in FIG. 10 form a series of passages 68 in the permeable segment 70 of the heat exchanger module 60. The heat transfer fluid flows through the passages 68 as is illustrated by the arrows in FIG. 11. The bosses 66 provide spacers to maintain uniform spacing of the passages 68 and increase the rigidity of the permeable element 76. The segments of the stacked plates which are not coined are bonded together and form the impervious section 72. The permeable/impervious interface 73 is formed by the edges 74 of the recessed regions 64 as shown in FIG. 10. Circular channels 76 are provided at the permeable/impervious interface 73 and intersect the permeable/impervious interface 73 such that the diameter of the cylindrical channel 76 lies in the permeable/impervious interface 73.

While the size of an individual heat exchanger module 10 is limited, the modules can be coupled and allow the development of heat transfer surfaces of arbitrary size and shape.

Figure 12:
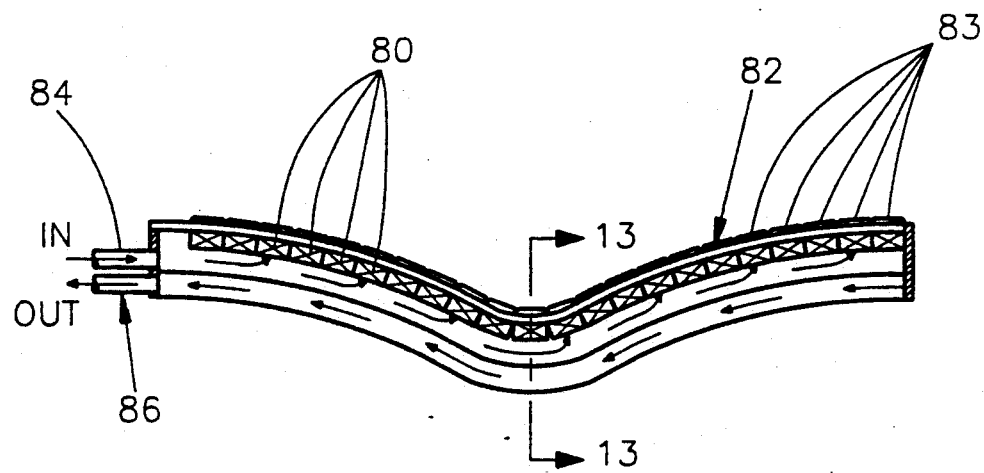
FIG. 12 is a schematic representation of a series of modules such as illustrated in FIG. 3 which are coupled to form an expanded heat transfer surface.

FIG. 12 illustrates a series of heat exchanger modules 80 which are coupled in a parallel arrangement to form an extended heat transfer surface 82 for cooling tungsten tiles 83 attached to the heat transfer surface 82. The heat exchanger modules 80 are attached to an inlet duct 84 and an outlet duct 86.

Figure 13:
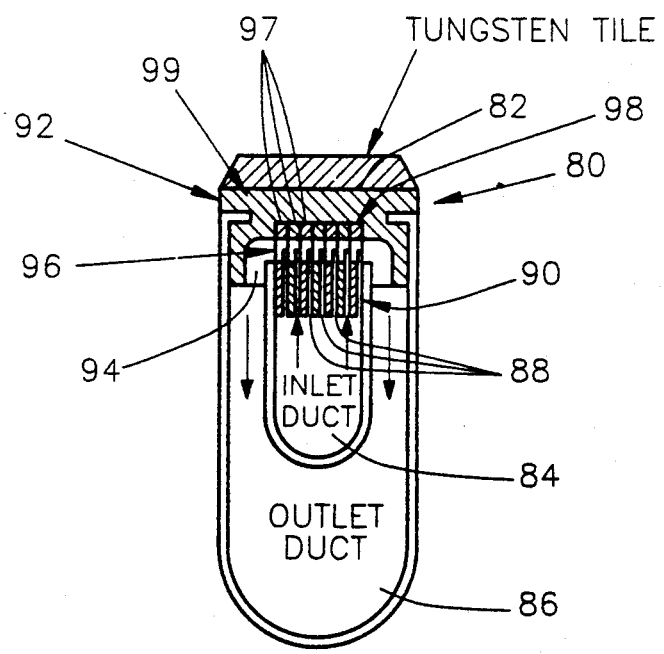
FIG. 13 is a section 13—13 of FIG. 12 illustrating the passages and channels of one of the modules of FIG. 12 and their connection to inlet and outlet fluid supply ducts.

A cross section of the ducts and a cross section of the heat exchanger modules are shown in FIG. 13. The inlet duct 84 is positioned in the outlet duct 86. The inlet duct 84 is sealed to the heat exchanger modules 80 such that the fluid in the inlet duct 84 will flow through the passages 88 of the permeable element 90. The impervious element 92 of the module 80 is attached to the outlet duct 86. The channels 94 of the heat exchanger module 80 open into the outlet duct 86.

For the heat exchanger module 80 shown in FIG. 13 the porous/impervious interface 96 is generated from stacking a series of plates 97 having recessed regions therein, as discussed with regard to FIG. 10 and 11. However, in this embodiment the bosses or spacers are not employed. The impervious element 92 is a two component element. An inset impervious element 98 is formed by the series of bonded plates 97. The inset impervious element 98 is embedded in a continuous solid element 99.

By using a series of elements as illustrated in FIGS. 12 and 13 the heat transfer surface 82 need not be planar but may take on arbitrary shapes limited only by the size of the individual modules.

Figure 14:
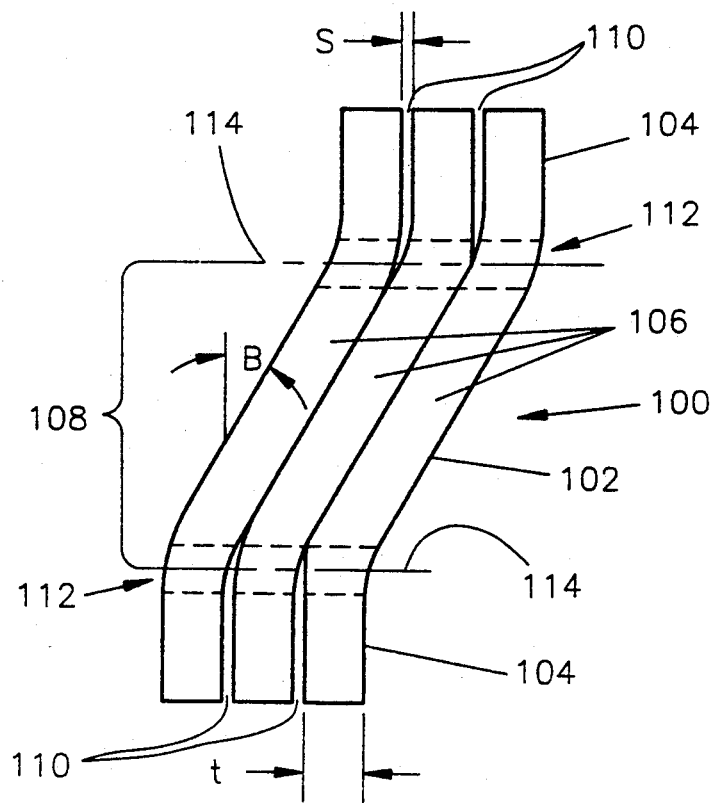
FIG. 14 is a schematic representation of the heat exchanger module of the present invention which is composed of stacked bent plates.

FIG. 14 is a schematic representation of an alternative embodiment of a heat exchanger of the present invention for use in a two fluid heat exchanger. The heat exchanger module 100 has an impervious element 102 and permeable elements 104 extending therefrom. The heat exchanger module 100 is formed from sheets 106 which are bent in two locations at an angle B. The bent sheets are stacked so as to have common areas 108 in contact. Due to slight variation in the length of the bent section there can be corresponding variation in the location of the interface as is illustrated in FIG. 14. Again this will introduce irregularities in the porous/impervious interface.

Bending the plates having a thickness t and stacking the plates creates a separation s which is:

$$s = t[\sec(B) - 1]$$

The separation s provides passages 110 in the permeable elements 104. The areas 108 are preferably joined by brazing or diffusion bonding to form the impervious element 102. A series of aligned holes 112 are provided in the sheets 108. The holes 112 form passages essentially at the interface 114 between the impervious element 102 and the permeable elements 104. Actual coincidence with the interface may not be maintained at all points due to the irregularities in the interface.

Figure 15:
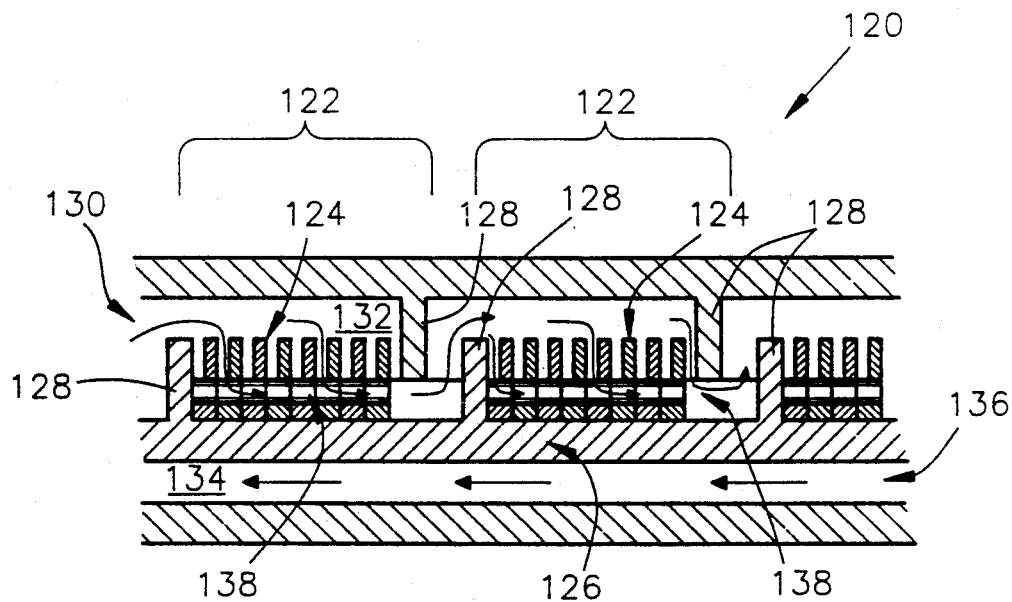
FIG. 15 is a schematic representation of a series of heat exchanger modules so connected to provide a quasi counter flow heat exchanger.

FIG. 15 shows a quasi counter flow heat exchanger 120 composed of heat exchanger modules connected in series. The heat exchanger 120 has heat exchanger modules 122. Each module 122 has permeable heat transfer elements 124. The modules 122 share a common impervious element 126. Partitions 128 separate the permeable heat transfer elements 124. A first duct 130 encloses the permeable heat transfer elements 124. A first fluid 132 flows through the first duct 130 above the impervious heat transfer element 126. A second heat transfer fluid 134 flows through a second duct 136 below the impervious heat transfer element 126. Again, as discussed with regard to FIG. 13, the impervious element 126 can be a composite element.

The first fluid 132 and the second fluid 134 flow in opposite directions thus creating a counter flow heat exchanger. The first fluid 132 flows through the permeable elements 124 into the channels 138 which are provided in the impervious element 126 and passes around the partition plates 128. The configuration of FIG. 15 provides for the output of the channels of one module, providing the supply for the passages in the subsequent module.

Heat transfer between the second fluid 134 and the impervious heat transfer element 126 can be increased by providing fins (not shown) which extend into the second fluid 134, and thus increase the surface area contacted by the second fluid 134. Alternatively a series of permeable elements can be provided to increase the heat transfer.

Figure 16:
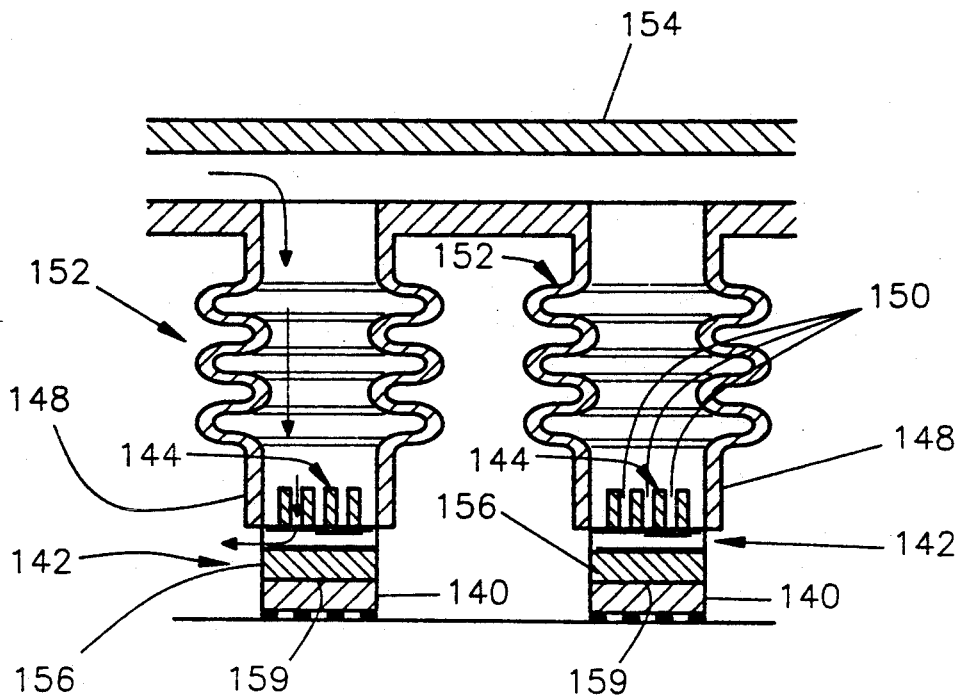
FIG. 16 is a schematic representation of a heat exchanger of the present invention for the cooling of semiconductor chips.

FIG. 16 illustrates another embodiment of the heat exchanger modules of the present invention which is designed for cooling of semiconductor chips 140. Heat exchanger modules, 142 are employed to cool the semiconductor chips 140. The heat exchanger modules 142 illustrated in FIG. 16 are similar to the heat exchanger module illustrated in FIG. 3. The permeable heat transfer elements 144 of the heat exchanger 142 is attached to tubing 148 and communicates with the passages 150 in the permeable heat transfer elements 144. The tubing 148 supplies air which serves as the coolant which flows through the passages 150 which are substantially normal to the permeable/impervious interfaces. Attached to the tubing 148 are flexible bellows 152 which in turn attach to a fixed plenum 154 which supplies air. The bellows 152 are of such a length so that during operation they maintain a positive pressure on the semiconductor chip 140 by the impervious heat transfer element 156. The higher air pressure inside the bellows 152 tends to extend the length of the bellows 152 and assists in maintaining good thermal contact at the semiconductor interface 159.

Figure 17:
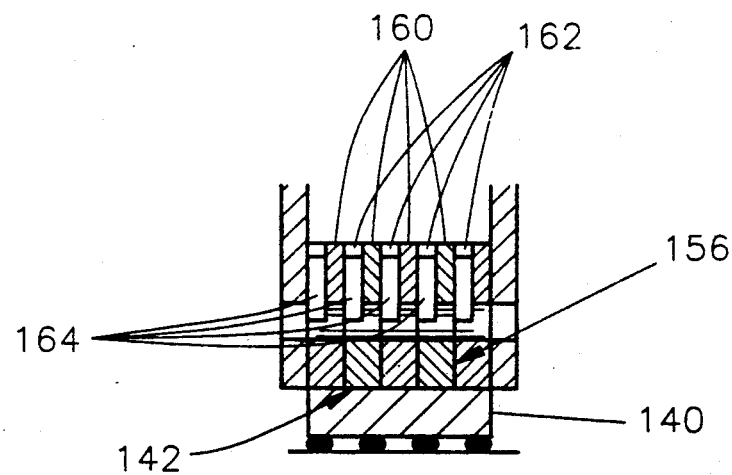
FIG. 17 is a schematic representation of a heat exchanger element for cooling a computer chip which displays a series of stacked plates.

FIG. 17 illustrates another heat exchanger module for cooling semiconductor chips 140. The heat exchanger module 142 is constructed from a series of coined plates 160 and is similar to the construction of the heat exchanger module illustrated in FIGS. 10 and 11. The plates, as in the embodiment of FIGS. 10 and 11, are stacked and bounded together to form an impervious element 156 and the bosses 162 serve to stabilize the channels 164.

Figure 18:
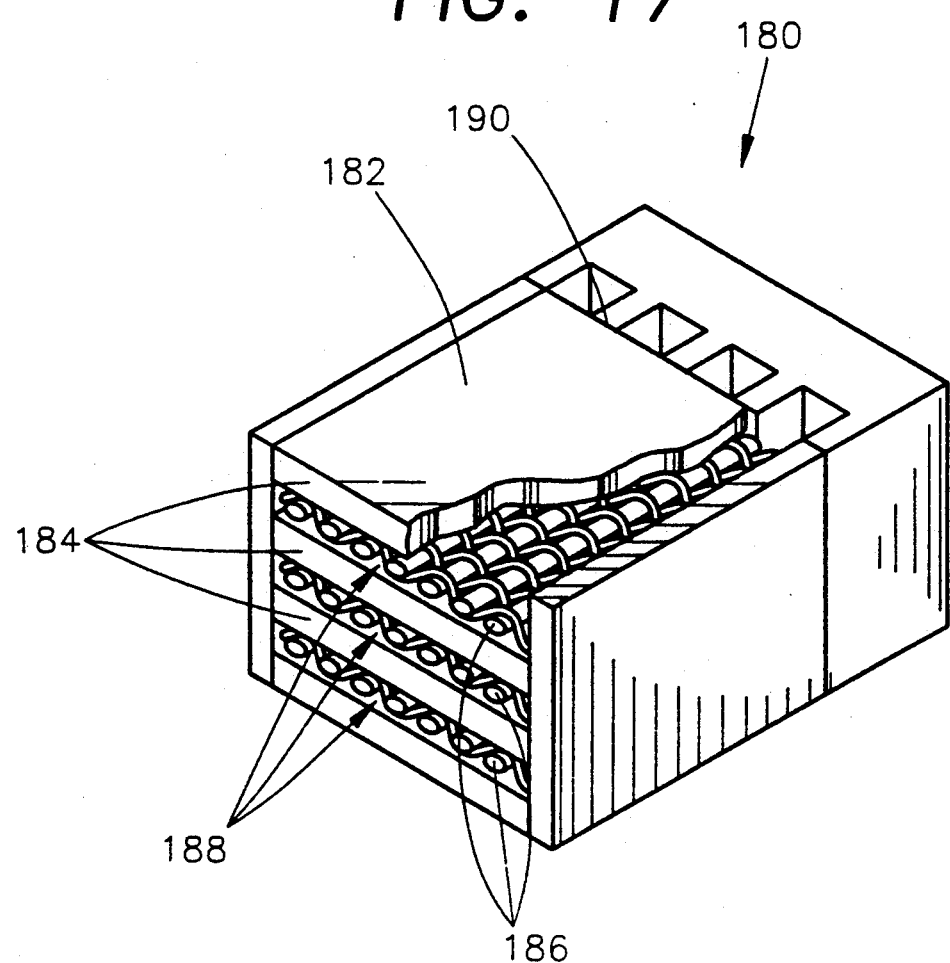
FIG. 18 is a schematic representation of a heat exchanger element where the permeable element is a series of plates in close proximity with spaces therebetween creating passages therebetween. Positioned in the passages are a series of screens.

FIG. 18 illustrates another configuration for the heat exchanger module 180 of the present invention wherein the permeable element 182 is a series of spaced apart plates 184. This embodiment differs from the heat exchanger of FIG. 3 in that screens 186 are placed in the passages 188 and are in thermal contact with the permeable/impervious interface 190 and the plates 184. Having screens so positioned and in thermal contact with the interface enhances the thermal performance of the permeable element.

EXAMPLE

A heat exchanger module of the general configuration shown in FIG. 3 was fabricated out of a solid block of copper. The passages on the permeable element were machined to a 0.113 mm width and 3.48 mm depth using travelling wire EDM. Circular exit channels with a diameter of 1.53 mm were drilled in such a manner that the diameter of the channel intersected the bottom of the passages in the permeable element. The frontal area of the permeable element was 1 cm$^2$. The heat exchanger module was used to remove heat from an electrical resistance heater simulating the heat addition to the diverter plates in a fusion energy reactor. The heat transfer fluid was helium gas at an absolute pressure of 3.1 MPa (450 psia). Heat fluxes as high as 850 W/cm$^2$ were achieved with an effectiveness of 90%. The pressure drop in the heat exchanger was only 13 cm of water.

While the novel features of the present apparatus have been described in terms of particular embodiments and preferred applications, it should be appreciated by one skilled in the art that substitution of materials and details obviously can be made without departing from the spirit of the invention.

What is claimed is:

1. A compact heat exchanger module comprising:
   an impervious heat transfer element;
   a permeable heat transfer element having one or more passages through which a heat transfer fluid passes, said passages being bound by one or more plates;
   a permeable/impervious interface where said impervious heat transfer element and said permeable heat transfer element are joined, said permeable/impervious interface being positioned such that said one or more plates are substantially normal to said permeable/impervious interface;

channels communicating with said passages of said permeable heat transfer element, said channels being essentially at said permeable/impervious interface; and means for directing the fluid through said passages substantially normal to said permeable/impervious interface.

2. The compact heat exchanger of claim 1 wherein said one or more plates is a series of plates in close proximity, said series of plates having spaces therebetween, said spaces therebetween forming more than one passage; and further wherein said means for directing the fluid passing through said passages substantially normal to said permeable/impervious interface further comprises:

side walls attached to said plates in close proximity, said side walls being attached to said plates in close proximity and substantially normal to said permeable/impervious interface such that said side walls close said passages in the direction parallel to said permeable/impermeable interface.

3. The compact heat exchanger module of claim 2 wherein said passages have a hydraulic diameter of less than about 1 mm.

4. The compact heat exchanger module of claim 3 wherein said channels have a hydraulic diameter and said passages have a length greater than about three times said hydraulic diameter of said channels.

5. The compact heat exchanger module of claim 4 wherein said channels have a length not greater than about 2 cm.

6. The compact heat exchanger module of claim 2 further comprising spacers positioned between said plates of said permeable heat transfer element.

7. The compact heat exchanger module of claim 6 wherein said channels reside in said impervious element.

8. The compact heat exchanger module of claim 6 wherein said interface channels are cylindrical and are positioned such that their diameters reside in said interface.

9. The compact heat exchanger module of claim 1 wherein said passage is bound by one plate, said plate forming a spiral path $p_s$ and have an open ended passage, said spiral path $p_s$ being sufficient length to provide said means for directing said flow through said passage substantially normal to said permeable impervious interface.

10. The compact heat exchanger module of claim 9 wherein said passage has a spiral passage height $l_s$ and wherein said ratio $p_s/l_s$ is greater than about 3.

11. The compact heat exchanger module of claim 1 wherein said one or more plates is a series of plates in close proximity, said plates being cylindrical and separating passages which are concentric rings, said concentric rings forming closed paths providing said means for directing the fluid through said passages substantially normal to the permeable/impervious interface.

12. The compact heat exchanger module of claim 1 wherein said one or more plates form a series of open sided passages having a breadth $b_p$ sufficient to serve as said means for directing the fluid through the passages normal to said permeable impervious interface.

13. The compact heat exchanger module of claim 12 wherein said passages have a passage height $l_h$ and the ratio $b_p/l_h$ is greater than 5.

14. The compact heat exchanger module of claim 1 wherein said one or more plates is a series of plates in close proximity forming more than one passage, and further wherein said permeable/impervious interface is an open ended closed surface, said surface passing through said series of plates such that said series of plates is substantially normal to said surface thereby providing continuous passages in the circumferential direction, the continuity serving as said means for directing the fluid through said passages substantially normal to said permeable/impervious interface.

15. The compact heat exchanger module of claim 1 further comprising a screen, said screen being positioned in said one or more passages such that it is in thermal contact with said permeable impervious/interface and said one or more plates.

16. The compact heat exchanger module of claim 2 further comprising screens, said screens being positioned in said channel such that said screens are in thermal contact with said permeable impervious/interface and said one or more plates.

17. The compact heat exchanger module of claim 14 further comprising a screen, said screen being positioned in said passages such that it is in thermal contact with said permeable impervious/interface and said one or more plates.

18. A compact heat exchanger module comprising:
an impervious heat transfer element;
a permeable heat transfer element having passages through which a heat transfer fluid passes, said permeable element being a porous element having interconnected pores which form said passages;
a permeable/impervious interface where said impervious heat transfer element and said permeable heat transfer element are joined;
channels communicating with said passages of said permeable element, said channels being essentially at said permeable/impervious interface; and
means for directing the fluid passing through said passages substantially normal to said permeable/impervious interface.

19. The compact heat exchanger module of claim 18 wherein said means for directing the fluid passing through said passages substantially normal to said permeable/impervious interface further comprises:
at least one sidewall attached to said porous element, said sidewall terminating passages which run parallel to said permeable/impermeable interface.

20. The compact heat exchanger module of claim 19 wherein said passages have a hydraulic diameter of less than about 1 mm.

21. The compact heat exchanger module of claim 20 wherein said channels having a hydraulic diameter and said passages have a length not greater than about three times said hydraulic diameter of said channels.

22. The compact heat exchanger module of claim 21 wherein said channels have a length not greater than about 2 cm.

23. The compact heat exchanger module of claim 19 wherein said interface is planar and said channels reside in said impervious element.

24. The compact heat exchanger module of claim 19 wherein said interface channels are cylindrical and are positioned such that their diameter resides in said interface.

25. The compact heat exchanger module of claim 19 wherein at least one sidewall is a pair of sidewalls bounding said porous material and further wherein said permeable/impervious interface is an open ended closed surface, said surface passing through said spaced apart sidewalls and said porous material, said surface being substantially normal to said sidewalls, and said porous material forming an annulus about said open ended closed surface, said annulus of porous material in cooperation with said sidewall providing said means for directing the fluid through said passages substantially normal to said permeable/impervious interface.

26. A multi-module compact heat exchanger comprising:
at least two modules, each of said modules having;
an impervious heat transfer element,
a permeable heat transfer element having passages through which a heat transfer fluid passes,
a permeable/impervious interface where said impervious heat transfer element and said permeable heat transfer element are joined,
channels communicating with said passages of said permeable medium essentially at said interface, and
means for directing the fluid passing through said passages substantially normal to said permeable/impervious interface;
wherein said modules have a common impervious heat transfer element, said heat transfer modules being connected in series whereby said channels' output of the heat transfer fluid provides an input of heat transfer fluid for said passages in said permeable heat transfer element;
a first duct enclosing said permeable heat transfer elements for directing the flow of a first heat transfer fluid;
partitions in said duct separating said permeable heat transfer elements; and
a second duct attached to said impervious heat transfer element providing a counter-flow of a second fluid.

27. The multi-module compact heat exchanger of claim 26 wherein said permeable heat transfer element has one or more plates substantially normal to said permeable/impervious interface, said passages being bound by said one or more plates.

28. The multi-module compact heat exchanger of claim 26 wherein said permeable heat transfer element is a porous element.

29. The multi-module compact heat exchanger of claim 27 wherein said one or more plates form a series of plates in close proximity having spaces therebetween, said spaces forming said passages; and further wherein said means for directing the fluid passing through said passages substantially normal to said permeable/impervious interface further comprises:
side walls attached to said plates in close proximity, said side walls being attached to said one or more plates and substantially normal to said permeable/impervious interface such that said side walls close said passages in the direction parallel to said permeable/impermeable interface.

30. The multi-module compact heat exchanger module of claim 29 further comprising spacers positioned between said one or more plates in close proximity.

31. The multi-module compact heat exchanger module of claim 28 wherein said means for directing the fluid passing through said passages substantially normal to said permeable/impervious interface further comprises:
at least one sidewall attached to said porous element, said sidewall terminating passages which run parallel to said permeable/impermeable interface.

32. A heat exchanger for cooling a semiconductor chip comprising:
a compact heat exchanger module of claim 1;
a tube communicating with said passages in said permeable heat transfer element; and
means for maintaining said impervious heat transfer element in contact with the semiconductor chip.

33. A heat exchanger for cooling a semiconductor chip comprising:
a compact heat exchanger module of claim 2;
a tube communicating with said passages in said permeable heat transfer element; and
means for maintaining said impervious heat transfer element in contact with the semiconductor chip.

34. A heat exchanger for cooling a semiconductor chip comprising:
a compact heat exchanger module of claim 18;
a tube communicating with said passages in said permeable heat transfer element; and
means for maintaining said impervious heat transfer element in contact with the semiconductor chip.

35. A heat exchanger for cooling a semiconductor chip comprising:
a compact heat exchanger module of claim 19;
a tube communicating with said passages in said permeable heat transfer element; and
means for maintaining said impervious heat transfer element in contact with the semiconductor chip.

36. The heat exchanger of claim 32 wherein an air supply line is provided to supply air to said tube and said means for maintaining said impervious heat transfer element in contact with the semiconductor chip comprises:
a plenum fixed relative to the semiconductor chip; and
a flexible bellows connecting said air supply airline to said tube, said bellows being of a length sufficient to provide a compressive load on the chip.

37. The heat exchanger of claim 33 wherein an air supply line is provided to supply air to said tube and said means for maintaining said impervious heat transfer element in contact with the semiconductor chip comprises:
a plenum fixed relative to the semiconductor chip; and
a flexible bellows connecting said air supply airline to said tube, said bellows being of a length sufficient to provide a compressive load on the chip.

38. The heat exchanger of claim 34 wherein an air supply line is provided to supply air to said tube and said means for maintaining said impervious heat transfer element in contact with the semiconductor chip comprises:
a plenum fixed relative to the semiconductor chip; and
a flexible bellows connecting said air supply airline to said tube, said bellows being of a length sufficient to provide a compressive load on the chip.

39. The heat exchanger of claim 35 wherein an air supply line is provided to supply air to said tube and said means for maintaining said impervious heat transfer element in contact with the semiconductor chip comprises:
a plenum fixed relative to the semiconductor chip; and
a flexible bellows connecting said air supply airline to said tube, said bellows being of a length sufficient to provide a compressive load on the chip.

* * * * *